United States Patent
Apalkov et al.

(10) Patent No.: US 10,885,961 B2
(45) Date of Patent: Jan. 5, 2021

(54) RACE-TRACK MEMORY WITH IMPROVED WRITING SCHEME

(71) Applicant: Samsung Electronics Co., Ltd., Suwon-si (KR)

(72) Inventors: Dmytro Apalkov, San Jose, CA (US); Sebastian Schafer, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/539,775

(22) Filed: Aug. 13, 2019

(65) Prior Publication Data
US 2020/0294565 A1 Sep. 17, 2020

Related U.S. Application Data

(60) Provisional application No. 62/818,626, filed on Mar. 14, 2019.

(51) Int. Cl.
*G11C 11/15* (2006.01)
*G11C 11/16* (2006.01)

(52) U.S. Cl.
CPC ........... *G11C 11/161* (2013.01); *G11C 11/15* (2013.01); *G11C 11/1673* (2013.01); *G11C 11/1675* (2013.01)

(58) Field of Classification Search
CPC ... G11C 11/161; G11C 11/15; G11C 11/1673; G11C 11/1675
See application file for complete search history.

(56) References Cited

U.S. PATENT DOCUMENTS

| | | | |
|---|---|---|---|
| 6,834,005 B1 | 12/2004 | Parkin | |
| 7,738,278 B2 * | 6/2010 | Kim | G11C 11/15 365/80 |
| 7,768,809 B2 * | 8/2010 | Trouilloud | G11C 19/0841 365/81 |
| 8,339,728 B2 * | 12/2012 | Kim | G11C 19/0808 360/80 |
| 2009/0296461 A1 * | 12/2009 | Kang | H01L 27/228 365/171 |
| 2010/0085659 A1 | 4/2010 | Choe et al. | |
| 2011/0002163 A1 | 1/2011 | Fukami et al. | |
| 2013/0140660 A1 | 6/2013 | Fukami et al. | |
| 2014/0268981 A1 | 9/2014 | Annunziata et al. | |
| 2014/0355337 A1 | 12/2014 | O'Grady et al. | |
| 2016/0056368 A1 | 2/2016 | Parkin et al. | |
| 2018/0039881 A1 | 2/2018 | Frank et al. | |
| 2018/1018390 | 4/2018 | Fukami et al. | |

* cited by examiner

*Primary Examiner* — Pho M Luu
(74) *Attorney, Agent, or Firm* — Lewis Roca Rothgerber Christie LLP

(57) ABSTRACT

A memory system includes a memory track including a plurality of magnetic domains having alternating magnetic polarities and positioned along a path, and a plurality of domain walls separating adjacent ones of the plurality of magnetic domains, each one of the domain walls being configured to store data.

20 Claims, 4 Drawing Sheets

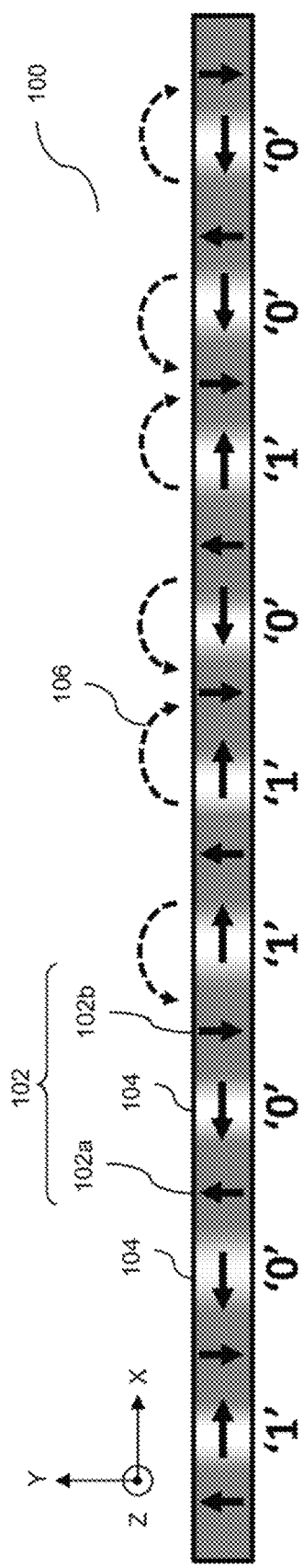
FIG. 1
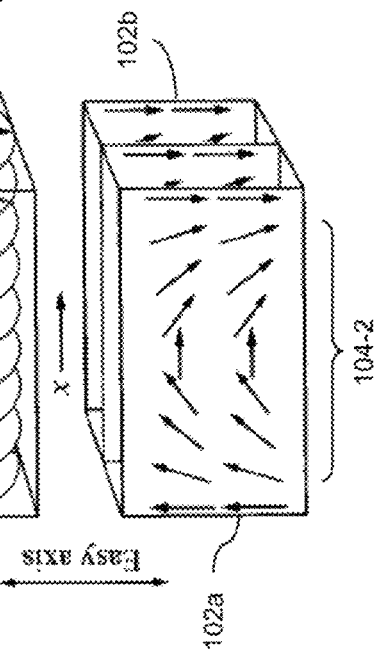
FIG. 2A
FIG. 2B

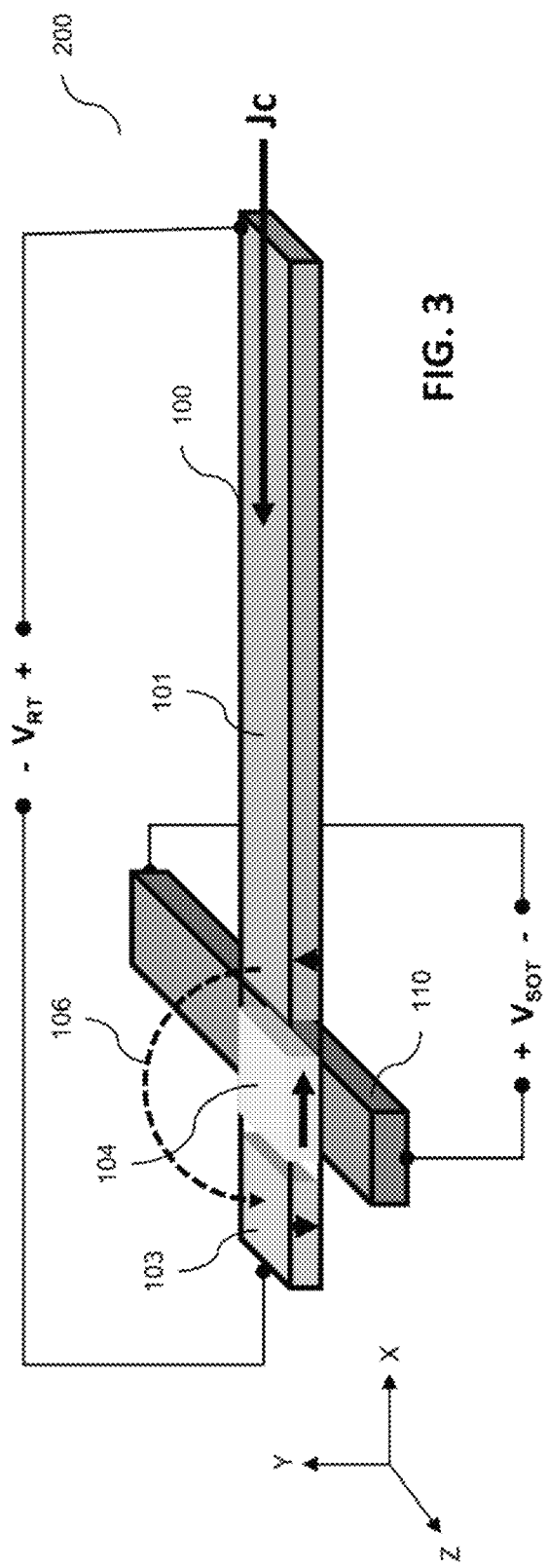
FIG. 3
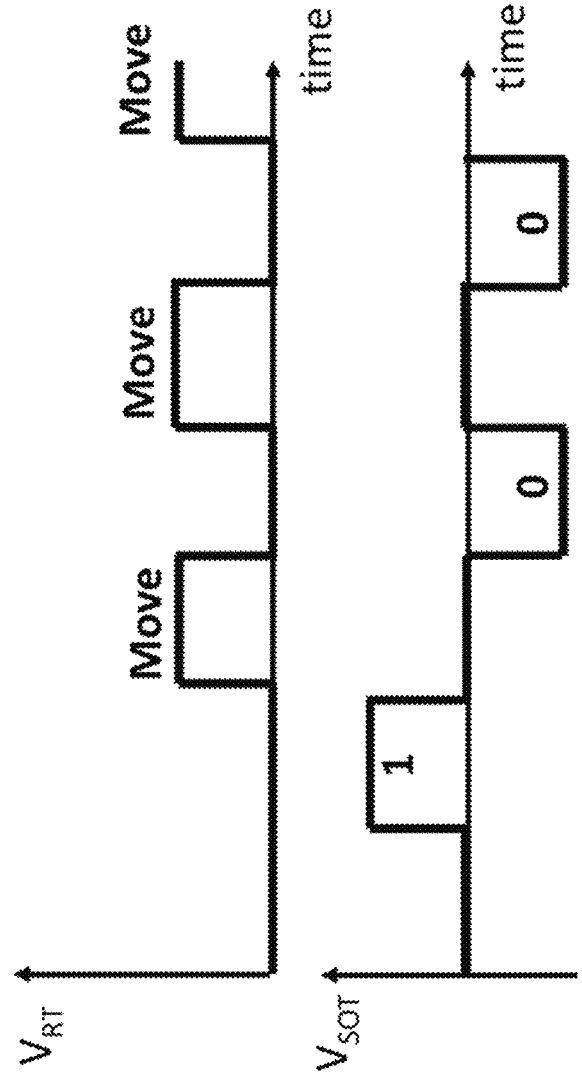
FIG. 4A
FIG. 4B

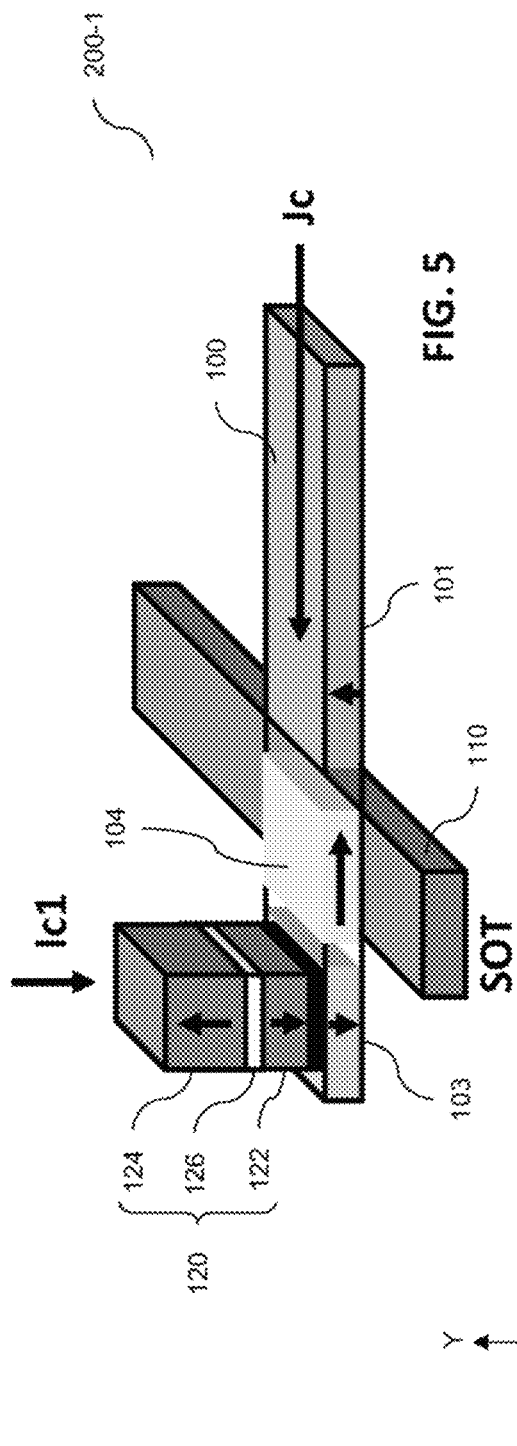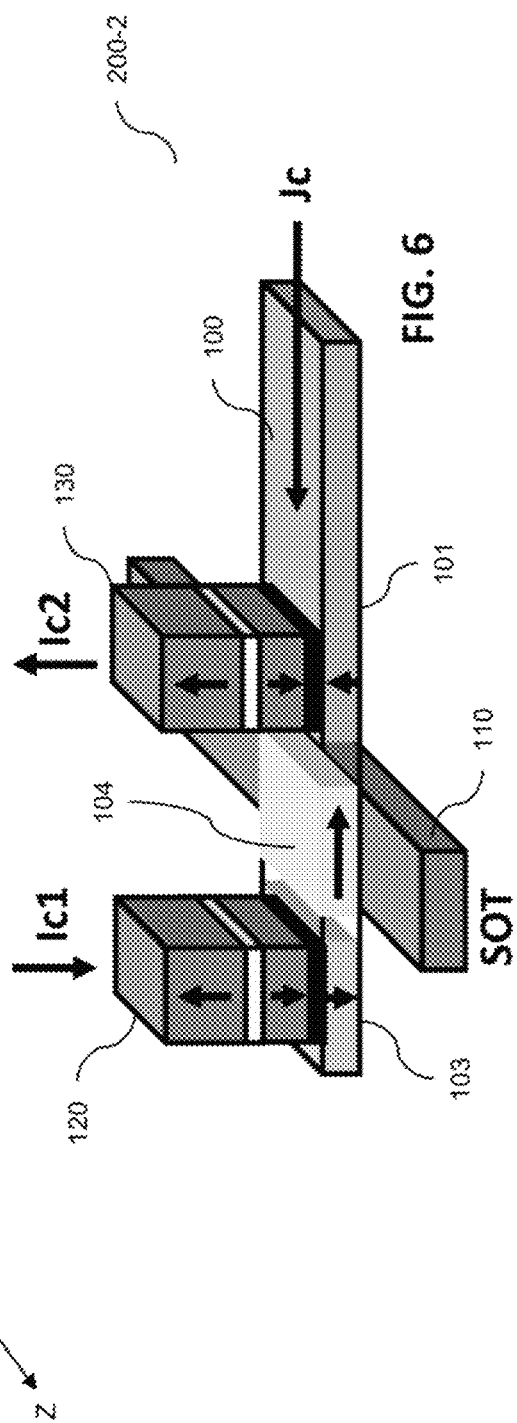

RACE-TRACK MEMORY WITH IMPROVED WRITING SCHEME

CROSS-REFERENCE TO RELATED APPLICATION(S)

This application claims priority to, and the benefit of, U.S. Provisional Application No. 62/818,626 ("RACE-TRACK MEMORY WITH IMPROVED WRITING SCHEME"), filed on Mar. 14, 2019, the entire content of which is incorporated herein by reference.

FIELD

Aspects of embodiments of the present disclosure are generally related to a race-track memory.

BACKGROUND

Recently, computing has experienced an explosion of data. In many applications, the data generated is growing at an exponential rate. As such, improving the storage density and read/write speeds of storage devices is of great interest. Currently, there are efforts underway to completely replace magnetic disk drives with solid state drives that have no moving parts, are more reliable, consume less energy, and are significantly faster than conventional drives.

A spintronics-based magnetic memory that uses spin polarized currents (i.e., current of spin angular momentum) to manipulate the magnetic regions along a race track has been proposed. This magnetic memory stores information in magnetic domains along a magnetic nanowire that are separated by notched magnetic domain walls. However, such memory relies on strong and consistent pinning of the domain walls, which may be difficult to achieve.

As a current is applied to the nanowire, the domain patterns along the wire move by one notch at a time so that the domain walls substantially correspond in location to the notches. However, it is difficult to make all of the notches the same (e.g., to make all having the same cross-section), therefore, some notches may have larger cross-sections (i.e., lower pinning potential) than others. When a current is applied, the speed of movement of the domain wall at that notch that has a larger cross-section is greater. As a result, a situation may occur where one domain wall is moved to the next notch, while a previous notch is not moved. This will result in an incorrect transfer or elimination of some bits along the race track and lead to a corruption of data stored.

Additionally, when two or more bits of the same kind are next to each other along the nanowire, it may be difficult to determine whether only one bit is present or two or more bits, because there are no domain walls between domains with the same polarity.

The above information disclosed in this Background section is only for enhancement of understanding of the present disclosure, and therefore it may contain information that does not form the prior art that is already known to a person of ordinary skill in the art.

SUMMARY

Aspects of embodiments of the present disclosure are directed to a memory system including a race-track memory that achieves clear bit to bit separation, mitigates the need for race-track notching or local pinning potentials, and improves flux closure and density. According to some embodiments, the memory system utilizes a spin orbital torque block and magnetic tunnel junction stacks to read and write information to a race-track memory.

According to some embodiments of the present disclosure, there is provided a memory system including: a memory track including: a plurality of magnetic domains having alternating magnetic polarities and positioned along a path; and a plurality of domain walls separating adjacent ones of the plurality of magnetic domains, each one of the domain walls being configured to store data.

In some embodiments, the memory track does not utilize domain wall pinning.

In some embodiments, the adjacent ones of the plurality of magnetic domains having antiparallel magnetic moments.

In some embodiments, the memory track has a uniform cross-section from a first magnetic domain of the magnetic domains to a second magnetic moment of the magnetic domains, the first and second magnetic domains being adjacent one another.

In some embodiments, magnetic moments of the plurality of domain walls are aligned with an extension direction of the memory track.

In some embodiments, the plurality of magnetic domains include ferromagnetic material or ferrimagnetic material, the ferromagnetic material includes at least one of cobalt, iron, nickel, boron, beryllium, magnesium, vanadium, titanium, and tantalum, and the ferrimagnetic material includes at least one of cobalt gadolinium and cobalt terbium.

In some embodiments, the path is a straight line.

In some embodiments, the plurality of domain walls include bloch domain walls and/or neel domain walls.

In some embodiments, the memory system further includes: a spin orbital torque (SOT) block overlapping the memory track at an overlap region and extending in a direction perpendicular to an extension direction of the memory track, the SOT block being configured to induce a magnetization in the overlap region of the memory track when a charge current passes through the SOT block.

In some embodiments, the magnetization is parallel to the extension direction of the memory track and is based on a direction of the charge current through the SOT.

In some embodiments, the SOT block directly contacts the memory track.

In some embodiments, the SOT block includes at least one of tungsten, platinum, and tantalum, and/or the like.

In some embodiments, the memory system further includes: a first magnetic tunnel junction (MTJ) stack on the memory track at a first region not overlapping the SOT block, the first MTJ stack including a plurality of layers stacked in a vertical direction orthogonal to extensions directions of the memory track and the SOT block.

In some embodiments, the first MTJ stack includes: a free layer including magnetic material and configured to exhibit a free magnetic moment substantially in the vertical direction; a fixed layer including magnetic material and exhibiting a fixed magnetic moment unaffected by stray fields and in the vertical direction; and a non-magnetic tunneling barrier layer between the free and fixed layers and configured to magnetically isolate the free magnetic moment of the free layer from the fixed magnetic moment of the fixed layer and to maintain any existing difference in directionality of the free and fixed magnetic moments.

In some embodiments, the first MTJ stack is configured to reorient a magnetic moment at the first region along the vertical direction in response to a first current passing through the first MTJ stack.

In some embodiments, the memory system further includes: a second magnetic tunnel junction (MTJ) stack on the memory track at a second region not overlapping the SOT block, the second MTJ stack including a plurality of layers stacked in the vertical direction, the first and second regions are at opposite sides of the overlap region.

In some embodiments, the second MTJ stack is configured to reorient a magnetic moment at the second region along the vertical direction in response to a second current passing through the second MTJ stack.

According to some embodiments of the present disclosure, there is provided a method of writing to a magnetic memory, the method including: applying a voltage across a length of a memory track, the memory track including: a plurality of magnetic domains having alternating magnetic polarities and positioned along a path; and a plurality of domain walls separating adjacent ones of the plurality of magnetic domains, each one of the domain walls being configured to store data, the voltage inducing movement of the plurality of magnetic domains and domain walls; and passing a charge current through a spin orbital torque (SOT) block overlapping the memory track at an overlap region and extending in a direction perpendicular to an extension direction of the memory track, the SOT block being configured to induce a magnetization in the overlap region of the memory track when the charge current passes through the SOT block.

In some embodiments, the voltage across the memory track is applied periodically, and the overlap region corresponds to a domain wall of the plurality of domain walls.

According to some embodiments of the present disclosure, there is provided a method of reading from a magnetic memory, the method including: applying a voltage across a length of a memory track, the memory track including: a plurality of magnetic domains having alternating magnetic polarities and positioned along a path; and a plurality of domain walls separating adjacent ones of the plurality of magnetic domains, each one of the domain walls being configured to store data, the voltage inducing movement of the plurality of magnetic domains and domain walls; and determining resistance across a magnetic tunnel junction (MTJ) stack on the memory track, the resistance corresponding to a bit value recorded on the memory track at an overlap region of the MTJ stack and the memory track.

BRIEF DESCRIPTION OF THE DRAWINGS

The accompanying drawings, together with the specification, illustrate example embodiments of the present disclosure, and, together with the description, serve to explain the principles of the present disclosure.

FIG. 1 illustrates a race-track memory utilizing domain walls to store information, according to some example embodiments of the present invention.

FIGS. 2A-2B illustrate Bloch and Neel domain walls, respectively, that can be utilized in the race-track memory, according to some example embodiments of the present invention.

FIG. 3 is schematic diagram illustrating a race-track memory writing device, according to some example embodiments of the present invention.

FIGS. 4A-4B are waveform diagrams illustrating the voltages applied across the memory track and a spin orbital torque block, respectively, with respect to time, according to some example embodiments of the present invention.

FIGS. 5-6 are schematic diagrams illustrating race-track memory writing devices, according to some example embodiments of the present invention.

DETAILED DESCRIPTION

Figure 7:
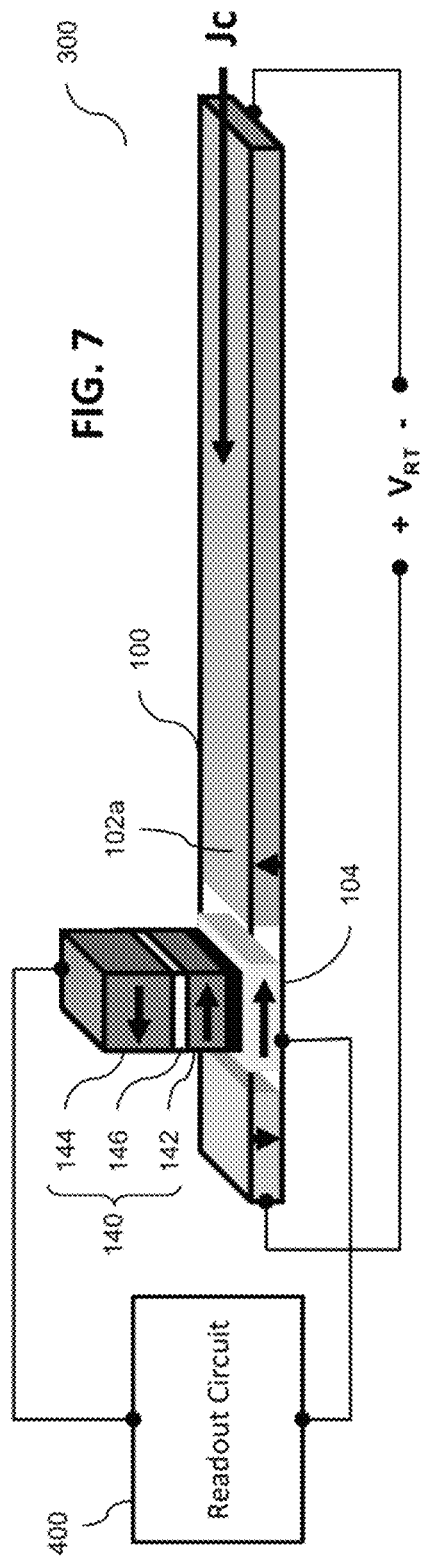
FIG. 7 is a schematic diagram illustrating race-track memory reading device, according to some example embodiments of the present invention.

The detailed description set forth below is intended as a description of example embodiments of a system and method for recording data in a magnetic memory, provided in accordance with the present disclosure, and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Embodiments of the present disclosure are directed to a memory system including a race-track memory that achieves clear bit to bit separation, mitigates the need for race-track notching or local pinning potentials, and improves flux closure and density.

FIG. 1 illustrates a race-track memory 100 utilizing domain walls to store information, according to some example embodiments of the present invention.

Referring to FIG. 1, according to some embodiments, a memory track (also referred to herein as "race-track memory") 100 includes a plurality of magnetic domains 102 having alternating magnetic polarities (e.g., alternating magnetic moments). The plurality of magnetic domains 102 may be organized along a path (e.g., a straight or curved line). Adjacent ones of the plurality of magnetic domains 102 may have opposite (i.e., anti-parallel) magnetic polarities, which are represented by alternating up and down arrows in FIG. 1 (as shown by domains 102a and 102b). The memory track 100 further includes a plurality of domain walls 104 separating adjacent ones of the plurality of magnetic domains 102. A magnetic domain 102 may represent a localized region of magnetic order (e.g., having a particular magnetic orientation) on an atomic level, and a domain wall 104 may represent the transition zone between two magnetic domains (the domain walls and the transition of the magnetization of individual atoms (or atomic layers) of a domain wall from the orientation of one magnetic domain 102 to the next is illustrated in FIGS. 2A and 2B). The size of the domain walls 104 may depend on the material parameters (e.g., perpendicular magnetic anisotropy (PMA), exchange interaction (Aex), volume magnetocrystalline anisotropy (Ku), micromagnetic Dzyaloshinskii-Moriya interaction (DMI)), etc., and may be a few atomic layers thick. For example, the size of the domain walls 104 may be about 2 nm to about 20 nm thick. According to some examples, tailoring the material to have larger domain-wall size may lead to improved readability, as will be described further below. However, the size of the magnetic domains 102 (i.e., the distance between domain walls 104) may not be dependent on the above material parameters. The distance between domain walls 104 may initially be set by timing and location of the domain wall nucleation and may then be kept relatively constant because the same force/torque may act on all domain walls when being moved, that is, all domain walls move at the same speed at the same time.

According to some embodiments, each one of the domain walls 104 is configured to store data (e.g., store a binary '0' or '1'), while the alternating domain do not store any information. This is unlike the related art in which the information is stored in the domains and which rely on notched walls to separate the domains from one another and to keep them in place. Here, the memory track 100 has a uniform cross-section along its length and does not rely on notching or perpendicular magnetic anisotropy (PMA) modifications (e.g., periodic changes in PMA along the length of the racetrack that provide "stop points", as opposed to, or in addition to, physical notches). For example, the memory track 100 has a uniform cross-section from a first magnetic domain 102a to a second magnetic domain 102b, which is adjacent to the first magnetic domain 102a. However, only one notch or increased cross section may be utilized at each end of the track to prevent the loss of stored bits at each end. As described in further detail below, as the domain walls are pushed toward an end of the memory track 100, as a result of a write or read process, the last domain wall 104 closest to the end point does not move any further once it reaches the terminating point having the notch or increased cross-section.

In some embodiments, magnetic moments of the plurality of domain walls 104 are aligned with (co-linear with) an extension direction of the memory track 100 (i.e., are "in plane" along, e.g., the X axis), and the magnetic moments of the magnetic domains 102 are orthogonal to the extension direction of the memory track 100. Here, the alternating magnetization of the domains 102 produces magnetic fields 106 that server to further reinforce the magnetization of each domain, as the magnetic fields produced by any domain 102 is aligned with the magnetization of the adjacent domains at their location. This is unlike the related art where information is stored the domains and two adjacent domains that store the same bit will generate magnetic fields that weaken the magnetization of the other domain. According to some embodiments, the added stability caused by the self-reinforcing magnetization allows the memory track 100 to store data at a higher density than the related art since the domains 102 can be packed closer together. This added stability also eliminates the need to introduce local pinning potential by, for example, creating physical notches in the memory track 100, as the self-reinforcing magnetization creates a more reliable motion of domain walls. Further, the clear bit-to-bit separation makes it easier to read data from and write data to the memory track 100.

According to some embodiments, the memory track 100 is a magnetic nanowire that includes ferromagnetic material or a ferrimagnetic material. The ferromagnetic material may include cobalt (Co), iron (Fe), nickel (Ni), alloys thereof, and/or the like. In some examples, the memory track 100 may be further alloyed with elements such as boron (B), beryllium (Be), magnesium (Mg), vanadium (V), titanium (Ti), tantalum (Ta), and/or the like. Furthermore, these ferromagnetic materials can also be combined into synthetic antiferromagnetic (SAF) stacks by insertion of a Ruderman-Kittel-Kasuya-Yosida (RKKY) based exchange coupling layer such as ruthenium (Ru), iridium (Ir), and/or the like. The ferrimagnetic material may be compensated or uncompensated ferrimagnets, including rare-earth based ferrimagnets, such as cobalt gadolinium (CoGd) and cobalt terbium (CoTb), and/or the like, as well as Heusler-based ferrimagnets. In some embodiments, the memory track 100 may have a substantially rectangular cross-section (e.g., in the Y-Z plane); however, embodiments of the present invention are not limited thereto, and the cross-section of the memory track 100 may have any suitable shape.

According to some embodiments, storing information at the domain walls can be achieved using both Bloch and Neel domain walls.

FIGS. 2A-2B illustrate Bloch and Neel domain walls, respectively, that can be utilized in the memory track 100, according to some example embodiments of the present invention. FIG. 2A illustrates a number of cross-sections of a bloch domain wall 104-1 and the direction of magnetization at each cross-section as indicated by the arrows. Here, the magnetization rotates perpendicular to the long axis (X) of the memory track 100 (e.g., in the clockwise or counter clockwise direction). Here, chirality (e.g. a sense of rotation) of the domain wall 104 will determine the orientation of the magnetic moment in the center of domain wall, which can encode information. In the bloch domain wall 104-1, the magnetization in the center is orthogonal to the extension direction of the memory track 100 and can point in the Z or −Z direction, which can represent a '0' or '1' bit value. FIG. 2B illustrates a number of cross-sections of a neel domain wall 104-2 and the direction of magnetization at each cross-section as indicated by the arrows. Here, the magnetization rotates along the long axis (X) of the memory track 100 in the Y-Z plane (e.g., in an upward or downward pointing arc). In the neel domain wall 104-2, the magnetization in the center is co-linear with the extension direction of the memory track 100 and can point in the X or −X direction, which can represent a '0' or '1' bit value.

FIG. 3 is schematic diagram illustrating a race-track memory writing device 200, according to some example embodiments of the present invention. FIGS. 4A-4B are waveform diagrams illustrating the voltages applied across the memory track 100 and a spin orbital torque block 110, respectively, with respect to time, according to some example embodiments of the present invention.

Referring to FIG. 3A, according to some embodiments, the race-track memory writing device 200 includes the memory track 100 and a spin orbital torque (SOT) block 110. The long-axes of the memory track 100 and SOT block 110 may cross each other (e.g., may be orthogonal to one another as shown in FIG. 3). In some embodiments, the SOT block 110 contacts the memory track 100; however, embodiments of the present invention are not limited thereto. For example, one or more intervening layers of may be present between the SOT block 110 and the memory track 100 at the overlap region. The intervening layer(s) may include material to improve either the SOT efficiency or optimize the magnetic layer properties. In some examples, the materials (e.g., Mg, Ti, V, Be) may introduce gradients in SOC, or the materials (e.g., MgO, HfO, W, Ta, Pt, and their oxides or nitrides) may modify PMA.

According to some examples, the SOT block 110 may comprise metal material (e.g., heavy/high density metal material) such as tungsten (W), platinum (Pt), tantalum (Ta), and/or the like. In some examples, the SOT block 110 may include a topological insulator such as BiSe, BiSb, and/or the like, or a Weyl semimetal such as WTe2, WSe2, and/or the like.

According to some embodiments, an electric current Jc is applied to the memory track 100 to move the magnetic moments within the domains and the domain walls along the memory track 100 past the SOT block 110. Here, the charge current Jc passing across the domain walls moves the domain walls in the direction of the current flow. Thus, the direction of the electric current determines the direction of movement of the magnetic moments along the memory track 100. For example, the electric current Jc shown in FIG. 3A may move the magnetic moments in a first direction (e.g., −X direction), while a reverse electric current may move the magnetic moments in a second direction (e.g., +X direction). As the charge current Jc passes through a domain, it may become "spin polarized", that is, the spins of its electrons may become oriented in the same direction. When this spin polarized current passes through a domain wall into the next domain, it develops a spin torque that moves the domain wall. Domain wall velocities may be very high, for example, on the order of 100 m/sec. As such, the process of moving a particular domain wall to the proper position for the purposes of changing its magnetic state by means of the SOT block 110 can be very short (e.g., in the order of sub nanoseconds).

The movement of the domains may be controlled by both the magnitude and direction of the charge current, and the time duration over which the charge current is applied. According to some embodiments, one charge current pulse of a specified magnitude and duration, is applied to move the domains in the storage region in one increment or step. As shown in FIG. 4A, a series of pulses may be applied to move the domains a number of increments or steps.

According to some embodiments, the SOT block 110 facilitates the recordation of a bit value in a region of the memory track overlapping the SOT block 110. When electrons pass through the SOT block 110, a spin-dependent scattering occurs, by which electrons with spin in one direction (e.g., X) may tend to drift up while electrons with spin along the opposite direction (e.g., −X) my tend to drift down. As a result, there may be more electrons on the top interface with spin along +X that are going to transfer this spin momentum (thus creating spin torque) on the ferromagnet in contact with SOT block 110.

As illustrated in FIGS. 4A-4B, application of a positive or negative voltage across the SOT block 110 records a '1' or '0' state in a region of the memory track overlapping the SOT block 110, which forms a domain wall 104. Subsequent application of the race track voltage $V_{RT}$ moves the domain wall pattern of the memory track 100. In the presence of positive voltage pulses shown in FIG. 4A, the domain wall pattern moves in a first direction (e.g., to the right) in step increments, however, negative voltage pulses of the race track voltage $V_{RT}$ would move the pattern in the opposite direction (e.g., to the left). In the example of FIG. 3, the first region 101 of the memory track 100 that is to the right of the domain wall 104 may be in an initial state (e.g., with a magnetization in the +Y-axis direction). The flux closure from the first region 101 that is in the initial state may switch the magnetization of a second region 103 of the memory track 100 that is on the other side of the recoded domain wall 104 from the first state to a second state (e.g., with a magnetization in the −Y-axis direction). The flux closure ensures that the first and second regions 101 and 103, which are magnetic domains separated by the recorded domain wall 104, have antiparallel magnetic moments.

For example, the magnetic field from first region 101 acts to make the second region 103 moment to be antiparallel to the magnetic moment of the first region 101, and magnetic field from the second region 103 acts to magnetize the first region 101 in the opposite orientation to the second region 103. Thus, the alternating magnetization of the magnetic domains 102 are created.

FIGS. 5-6 are schematic diagrams illustrating race-track memory writing devices 200-1 and 200-2, according to some example embodiments of the present invention. The race-track memory writing device 200-1 is the same as the race-track memory writing device 200 of FIG. 3, except for the presence of the first magnetic tunnel junction (MTJ) stack 120. The race-track memory writing device 200-2 is the same as the race-track memory writing device 200-1, except for the addition of the second MTJ stack 130.

Referring to FIG. 5, according to some embodiments, the race-track memory writing device 200-1 includes a first MTJ stack 120 on the memory track 100 at the second region 103. According to some embodiments, the MTJ stack 120 includes a free layer 122 on (e.g., adjacent to or contacting) the memory track 100, a pinned layer (e.g., a fixed layer or a reference layer) 124 on the free layer 122 opposite from the SOT block 110, and a nonmagnetic tunneling barrier layer (also referred to as a non-magnetic layer) 126 separating the free and pinned layers 122 and 124. The nonmagnetic tunneling barrier layer is configured to magnetically isolate the free magnetic moment of the free layer from the fixed magnetic moment of the fixed layer and to maintain any existing difference in directionality of the free and fixed magnetic moments. The MTJ stack 120 is stacked in a vertical direction (e.g., the Y direction) orthogonal to the interface between the SOT block 110 and the first MTJ stack 120. The pinned layer 124 includes magnetic material that exhibits a fixed (e.g., a pinned or permanent) axis of magnetization parallel to the interface between the memory track 100 and the MTJ stack 120 and in a direction (e.g., the X direction) orthogonal to (or substantially orthogonal to) the lengthwise direction (e.g., the Y direction) of the memory track 100. The free layer 122 also includes magnetic material and has an easy axis of magnetization that is parallel or anti-parallel to that of the pinned layer 124. According to some embodiments, the fixed layer 124 has a vertical magnetization (e.g., in the Y direction, as shown in FIGS. 5-6). The nonmagnetic tunneling barrier layer is configured to magnetically isolate the free magnetic moment of the free layer from the fixed magnetic moment of the fixed layer and to maintain any existing difference in directionality of the free and fixed magnetic moments.

In some embodiments, by passing a first current (e.g., a first charge current or "write" current) Ic1 through the first MTJ stack 120 in a vertical direction (e.g., the Y/−Y direction), the first MTJ stack 120 may affect the magnetization of the second region 103 to change in the direction of the first current Ic1. For example, if the current is in +Y direction, the magnetic moment of the first region 103 becomes parallel to that of the free layer 122, and if the current is in −Y direction, the magnetic moment of the first region 103 becomes antiparallel to the first region 122. Thus, by alternating the first current Ic1, the race-track memory writing devices 200-1 may create (e.g., write or record) an alternating magnetization pattern at the domains 102 of the memory track 100, which is self-reinforcing due to flux closure. According to some embodiments, the first current Ic1 may be applied concurrently with (e.g., simultaneously with) the recordation of a bit at the domain wall 104. That is, the writing to the domain wall 104 may be concurrent with (e.g., simultaneous with) the fixing of the magnetic domains adjacent to the domain wall 104.

The first current Ic1 may be a short pulse having a pulse duration of about 1 ns to about 100 ns (e.g., about 10 ns).

Referring to FIG. 6, according to some embodiments, the race-track memory writing device 200-2 includes a second MTJ stack 130 on the first region 101, which is on an opposite side of the domain wall 104 from the first MTJ stack 120. The second MTJ stack 130 may be substantially the same as the first MTJ stack 120, as such, a description of its constituent elements will not be repeated herein.

According to some embodiments, concurrent with the application of a first current (e.g., a first charge current) Ic1 to the first MTJ stack 120, a second current (e.g., a second charge current) Ic2 is applied to the second MTJ stack 130 to record/reinforce a magnetization in the first region 101 adjacent to the domain wall 104 that is opposite that of the second region 103. The second current Ic2 may applied in opposite direction (e.g., opposite vertical direction) as the first current Ic1. The first and second currents IC1 and IC2 may be applied concurrently with (e.g., simultaneously with) the recordation of a bit at the domain wall 104. That is, the writing to the domain wall 104 may be concurrent with (e.g., simultaneous with) the fixing of the magnetic domains adjacent to the domain wall 104.

In some examples, the size of the MTJ stack 120/130 may be small relative to the length of the memory track 100. Therefore, the presence of the first and/or second MTJ stack 120 and/or 130 may not affect memory storage density of the race-track memory in any meaningful way. For example, the MTJ stack 120/130 may be about 10 nm to about 80 nm (e.g., about 40 nm) wide and about 10 nm to about 150 nm (e.g., about 80 nm) high, while the memory track 100 may be in the range of about 100 μm or more.

Figure 8A:
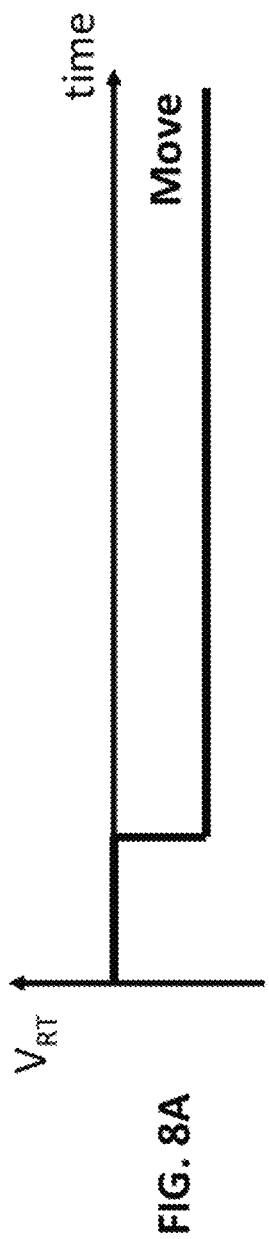
FIGS. 8A-8B are waveform diagrams illustrating the voltages respectively across the memory track and a resistance reading of a magnetic tunnel junction stack, with respect to time, according to some example embodiments of the present invention.
Figure 8B:
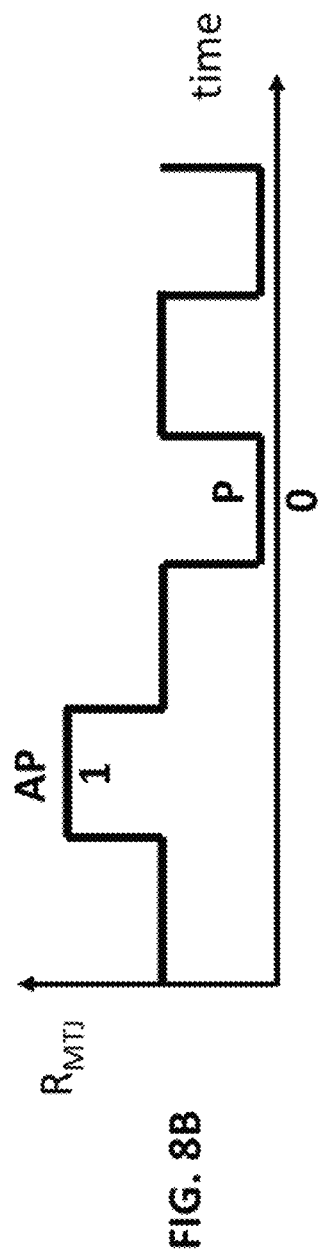

FIG. 7 is a schematic diagram illustrating race-track memory reading device 300, according to some example embodiments of the present invention. FIGS. 8A-8B are waveform diagrams illustrating the voltages respectively applied across the memory track 100 and a resistance reading of a third MTJ stack 140, with respect to time, according to some example embodiments of the present invention.

Referring to FIG. 7, according to some embodiments, the race-track memory reading device 300 includes a third MTJ stack 140 on the memory track 100. The third MTJ stack 140 may be substantially the same as the first MTJ stack 120, except that the magnetization of the fixed layer 144 may be parallel to the extension direction of the memory track (e.g., in the +/−X direction).

Referring to FIGS. 7-8B, when the application of the race track voltage $V_{RT}$ moves the domain wall pattern of the memory track 100. In the presence of a positive voltage, the domain wall pattern may move in a first direction (e.g., to the right), however, a negative voltage of the race track voltage $V_{RT}$ may move the pattern in the opposite direction (e.g., to the left, as shown in FIG. 8A). Application of a continuous (non-pulsed current) may move the magnetization pattern of the memory track 100 in a continuous manner. As the pattern moves along the length of the memory track 100, the magnetization of the domain wall 104 directly below the third MTJ stack 140 changes. The magnetization direction of the domain wall 104 relative to that of the fixed layer 144 affects the combined impedance of MTJ stack 140 and the domain wall 104, which is measured by the readout circuit 400. In some examples, the readout circuit 400 measures the locale impedance (e.g., ohmic resistance) across the third MTJ stack 140 and the memory track 100 at the overlap region of the track and stack. FIG. 8B illustrates the measured impedance $R_{MTJ}$ as function of time, which can be mapped to position along the magnetization pattern of the memory track 100. In some embodiments, when the magnetizations of the free layer 142 and fixed layer 144 are antiparallel (e.g., when the MTJ stack 140 overlaps a domain wall 104, as shown in FIG. 7), the measured resistance has a high value; when the magnetizations of the free layer 142 and fixed layer 144 are parallel, the measured resistance is low; and when the magnetizations of the free layer 142 and fixed layer 144 are orthogonal to one another (e.g., when the MTJ stack overlaps a magnetic domain 102), the measured resistance has an intermediate value, which may be an average between low and high resistance values. According to some examples, a high impedance may indicate a '1' bit value and a low impedance may indicate a '0' bit value; however, embodiments of the present invention are not limited thereto and the bit values may be reversed. According to some embodiments, the measured resistance value depends on the size of the MTJ stack. In some examples, when a resistance is high, the resistance-area product may be about 1 ohm*μm² to 200 ohm*μm², and when a resistance is low, the resistance-area product may be about 0.5 ohm*μm² to 100 ohm*μm².

As described herein, the memory system may include the race-track memory and one or more of the race-track memory writing devices 200, 200-1, and 200-2, and/or the race-track memory reading device 300.

Accordingly, the memory system to some embodiments of the present invention achieves clear bit to bit separation, mitigates the need for race-track notching or local pinning potentials (resolving a problem with domain wall moving speeds), improves flux closure and density, and is easier to read from, as it relies less on timing and the bits may be separated by domain.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on", "directly connected to", "directly coupled to", or "immediately adjacent" another element or layer, there are no intervening elements or layers present.

As used herein, the terms "use", "using", and "used" may be considered synonymous with the terms "utilize", "utilizing", and "utilized", respectively.

The memory system and/or any other relevant devices or components according to embodiments of the present disclosure described herein, such as the readout circuit, may be implemented by utilizing any suitable hardware, firmware (e.g., an application-specific integrated circuit), software, or any suitable combination of software, firmware, and hardware. For example, the various components of the memory system may be formed on one integrated circuit (IC) chip or on separate IC chips. Further, the various components of the memory system may be implemented on a flexible printed circuit film, a tape carrier package (TCP), a printed circuit board (PCB), or formed on the same substrate. Further, the various components of the memory system may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, and scope of this disclosure, as set forth in the following claims and equivalents thereof.

What is claimed is:
1. A memory system comprising:
a memory track comprising:
a plurality of magnetic domains having alternating magnetic polarities and positioned along a path; and
a plurality of domain walls separating adjacent ones of the plurality of magnetic domains, each one of the domain walls being configured to store data.

2. The memory track of claim 1, wherein the memory track does not utilize domain wall pinning.

3. The memory system of claim 1, wherein the adjacent ones of the plurality of magnetic domains having antiparallel magnetic moments.

4. The memory system of claim 1, wherein the memory track has a uniform cross-section from a first magnetic domain of the magnetic domains to a second magnetic moment of the magnetic domains, the first and second magnetic domains being adjacent one another.

5. The memory system of claim 1, wherein magnetic moments of the plurality of domain walls are aligned with an extension direction of the memory track.

6. The memory system of claim 1, wherein the plurality of magnetic domains comprise ferromagnetic material or ferrimagnetic material,
wherein the ferromagnetic material comprises at least one of cobalt, iron, nickel, boron, beryllium, magnesium, vanadium, titanium, and tantalum, and
wherein the ferrimagnetic material comprises at least one of cobalt gadolinium and cobalt terbium.

7. The memory system of claim 1, wherein the path is a straight line.

8. The memory system of claim 1, wherein the plurality of domain walls comprise bloch domain walls and/or neel domain walls.

9. The memory system of claim 1, further comprising:
a spin orbital torque (SOT) block overlapping the memory track at an overlap region and extending in a direction perpendicular to an extension direction of the memory track, the SOT block being configured to induce a magnetization in the overlap region of the memory track when a charge current passes through the SOT block.

10. The memory system of claim 9, wherein the magnetization is parallel to the extension direction of the memory track and is based on a direction of the charge current through the SOT.

11. The memory system of claim 9, wherein the SOT block directly contacts the memory track.

12. The memory system of claim 9, wherein the SOT block comprises at least one of tungsten, platinum, and tantalum, and/or the like.

13. The memory system of claim 9, further comprising:
a first magnetic tunnel junction (MTJ) stack on the memory track at a first region not overlapping the SOT block, the first MTJ stack comprising a plurality of layers stacked in a vertical direction orthogonal to extensions directions of the memory track and the SOT block.

14. The memory system of claim 13, wherein the first MTJ stack comprises:
a free layer comprising magnetic material and configured to exhibit a free magnetic moment substantially in the vertical direction;
a fixed layer comprising magnetic material and exhibiting a fixed magnetic moment unaffected by stray fields and in the vertical direction; and
a non-magnetic tunneling barrier layer between the free and fixed layers and configured to magnetically isolate the free magnetic moment of the free layer from the fixed magnetic moment of the fixed layer and to maintain any existing difference in directionality of the free and fixed magnetic moments.

15. The memory system of claim 13, wherein the first MTJ stack is configured to reorient a magnetic moment at the first region along the vertical direction in response to a first current passing through the first MTJ stack.

16. The memory system of claim 13, further comprising:
a second magnetic tunnel junction (MTJ) stack on the memory track at a second region not overlapping the SOT block, the second MTJ stack comprising a plurality of layers stacked in the vertical direction,
wherein the first and second regions are at opposite sides of the overlap region.

17. The memory system of claim 16, wherein the second MTJ stack is configured to reorient a magnetic moment at the second region along the vertical direction in response to a second current passing through the second MTJ stack.

18. A method of writing to a magnetic memory, the method comprising:
applying a voltage across a length of a memory track, the memory track comprising:
a plurality of magnetic domains having alternating magnetic polarities and positioned along a path; and
a plurality of domain walls separating adjacent ones of the plurality of magnetic domains, each one of the domain walls being configured to store data, the voltage inducing movement of the plurality of magnetic domains and domain walls; and passing a charge current through a spin orbital torque (SOT) block overlapping the memory track at an overlap region and extending in a direction perpendicular to an extension direction of the memory track, the SOT block being configured to induce a magnetization in the overlap region of the memory track when the charge current passes through the SOT block.

19. The method of claim 18, wherein the voltage across the memory track is applied periodically, and
wherein the overlap region corresponds to a domain wall of the plurality of domain walls.

20. A method of reading from a magnetic memory, the method comprising:
applying a voltage across a length of a memory track, the memory track comprising:
a plurality of magnetic domains having alternating magnetic polarities and positioned along a path; and
a plurality of domain walls separating adjacent ones of the plurality of magnetic domains, each one of the domain walls being configured to store data, the voltage inducing movement of the plurality of magnetic domains and domain walls; and
determining resistance across a magnetic tunnel junction (MTJ) stack on the memory track, the resistance corresponding to a bit value recorded on the memory track at an overlap region of the MTJ stack and the memory track.

* * * * *